(12) United States Patent
Lauchner

(10) Patent No.: US 6,600,665 B2
(45) Date of Patent: Jul. 29, 2003

(54) CABLE MANAGEMENT ARM WITH TROUGH AND BREAKAWAY FEATURE

(75) Inventor: Craig E. Lauchner, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/998,175

(22) Filed: Dec. 3, 2001

(65) Prior Publication Data

US 2003/0026084 A1 Feb. 6, 2003

Related U.S. Application Data

(60) Provisional application No. 60/309,826, filed on Aug. 3, 2001.

(51) Int. Cl.[7] .................................................. H02B 1/20
(52) U.S. Cl. ......................................... 361/826; 361/825
(58) Field of Search ................................. 361/825–829, 361/428, 383, 683, 725, 727

(56) References Cited

U.S. PATENT DOCUMENTS

| | | | | |
|---|---|---|---|---|
| 3,710,199 A | * | 1/1973 | Cignoni, Jr. ........... 174/DIG. 9 |
| 4,614,383 A | * | 9/1986 | Polley et al. .................. 174/69 |
| 6,021,047 A | * | 2/2000 | Lopez et al. ............. 312/223.2 |
| 6,070,742 A | * | 6/2000 | McAnally et al. ............ 211/26 |
| 6,303,864 B1 | * | 10/2001 | Johnson et al. ............ 174/68.3 |
| 6,305,556 B1 | * | 10/2001 | Mayer ......................... 211/175 |
| 6,326,547 B1 | * | 12/2001 | Saxby et al. ................... 174/69 |
| 6,435,354 B1 | * | 8/2002 | Gray et al. .................... 211/26 |

OTHER PUBLICATIONS

HP Cable Management Assembly on sale before Dec. 3, 2000.

* cited by examiner

Primary Examiner—David Martin
Assistant Examiner—Thanh S. Phan

(57) ABSTRACT

A cable management arm assembly for a computer server that includes a break-away link that allows the arm assembly to be pivoted away from the back panel of the computer server while the server is attached to a computer rack. The cable management arm further includes an inner arm section, an inner arm slide racket, an outer arm section and an outer arm slide bracket. The inner arm section is pivotably mounted to the inner arm slide bracket at one end, and is pivotably mounted to the break-away link at an opposite end. Likewise, the outer arm section is pivotably mounted to the outer arm slide bracket at one end, and is pivotably mounted to the break-away link at an opposite end. When the computer server is retracted into the rack, the sections pivot and rotate in such a manner that the inner arm section and the outer arm section are in contact with each other and are parallel, where the break-away link forms an extension of the outer arm section. The break-away link allows the folded arm assembly to pivot away from the back panel of the server when the server is in the retracted position.

45 Claims, 10 Drawing Sheets

CABLE MANAGEMENT ARM WITH TROUGH AND BREAKAWAY FEATURE

CROSS-REFERENCE TO RELATED APPLICATIONS

This application claims the benefit of U.S. Provisional Application No. 60/309,826, filed Aug. 3, 2001.

BACKGROUND OF THE INVENTION

1. Field of the Invention

This invention relates generally to a cable management arm for holding cables and, more particularly, to a cable management arm employing a break-away link and a stabilizing arm, where the cable management arm is used to collect and hold cables coupled to a computer server slidably mounted within a computer rack.

2. Discussion of the Related Art

Certain computer systems, such as computer network systems, typically include many separate computer units or servers that are positioned and stacked relative to each other in a rack. The various computer servers in the system are electrically interconnected and provide various functions, such as storage, communications, calculations, etc. The rack includes a plurality of support columns, where each computer server is secured to opposing slide assemblies attached to the columns. The slide assemblies allow the server to be pulled away from the front of the rack so that each separate server can be serviced by technicians for various reasons, such as maintenance, replacement of computer cards, etc., while the server is still in operation. In other words, in order for a technician to gain entrance to the server through top panels in the server, the server is slid forward away from the stack of servers in the rack to allow access thereto, while the server is still operational, so that the computer system does not have to go down during service.

A typical computer server includes a plurality of input and output cables coupled to a back panel of the server, including power cables, data cables, communication lines, keyboard lines etc., and may include up to fourteen separate cables, and possibly more. It is therefore desirable to include some type of cable management device, such as a cable management arm, that allows the various cables to be collected at the back of the computer server and rack for convenience and organization. The cable management arm is typically mounted to the rack and to the server in such a manner that when the computer server is pulled out of the rack on the slide assemblies, the cable management arm unfolds and extends to allow the cables mounted thereto to be maintained in their organized state.

Various cable management arms are known in the art that perform this function. The known arms include a cable management arm made by Jonathan, a cable management arm made by Accuride, cable management arms made by Dell, cable management arms made by Compaq and cable management arms made by IBM. Two cable management arms available from Hewlett-Packard include the LC Series cable management arm and the LH Series cable management arm. The various cable management arms known in the art generally come in two capacities to satisfy computer servers of different heights, and are referred to in the art and herein as 1U and 2U arms.

Known cable management arms generally are devices that include two arm sections that are connected together at a hinged joint. One of the arm sections includes a pivotable bracket that is secured to the housing of the computer server by a suitable bolt or the like, and the other arm section includes a pivotable bracket that is secured to a strategic location on the rack by a bolt or the like. Thus, when the computer server is slid out of the rack on the slide assemblies, the hinged joint allows the cable management arm to extend the desired distance into an extended position. When the server is pushed back into the rack, the two arm sections fold together so that they are substantially parallel with a back panel of the server when the server is completely slid into the rack.

The known cable management arms employ various techniques for securing the cables thereto. For example, some cable management arms employ velcro straps to secure the cables to the two arm sections. However, this type of arrangement presents a problem in that the cables must be bundled together and held with one hand while tightly wrapping the bundle with a velcro strap with the other hand. This process is repeated four to eight times to completely attach the cables to the arm. Adding or removing a cable from the arm requires removing and replacing every velcro strap.

SUMMARY OF THE INVENTION

In accordance with the teachings of the present invention, a cable management arm assembly for a computer server is disclosed that includes a break-away link that allows the arm assembly to be pivoted away from the back panel of the computer server while the server is attached to a computer rack by opposing slide assemblies. In addition to the break-away link, the cable management arm assembly includes an inner arm section, an inner arm slide bracket, an outer arm section and an outer arm slide bracket. The inner arm section is pivotably mounted to the inner arm slide bracket at one end, and is pivotably mounted to the break-away link at an opposite end. Likewise, the outer arm section is pivotably mounted to the outer arm slide bracket at one end, and is pivotably mounted to the break-away link at an opposite end. When the computer server is retracted into the rack, the sections fold together in such a manner that the inner arm section and the outer arm section are in contact with each other and are parallel, where the break-away link forms an extension of the outer arm section. The break-away link allows the folded arm assembly to pivot away from the back panel of the server when the server is in the retracted position. This allows greater access to the rear panel of the server.

In a specific embodiment, the cable management arm includes an extension link pivotably mounted between the outer arm section and the outer arm slide bracket to allow the arm assembly to extend a few extra inches for some applications. The cable management arm also may include a stabilizing arm attached to opposing outer slides that help stabilize the arm when it is moved to the break-away position.

Both the inner arm section and the outer arm section include a trough defined by a base plate and two opposing side plates. The opposing side plates of both the inner arm section and the outer arm section include openings to allow airflow around the cables. The cables coupled to a back panel of the server are threaded into the troughs of the inner arm section and outer arm section to be organized therein. In one embodiment, the inner arm slide bracket is mounted to a slidable member of the slide assembly proximate the computer server, and the outer arm slide bracket is mounted to an end of a stationary outer member of the slide assembly at a back of the rack.

Additional objects, advantages, and features of the present invention will become apparent from the following description and appended claims, taken in conjunction with the accompanying drawings.

DETAILED DESCRIPTION OF THE EMBODIMENTS

The following discussion of the embodiments of the invention directed to a cable management arm for a computer server mounted in a rack is merely exemplary in nature, and is in no way intended to limit the invention or its applications or uses.

Figure 1:
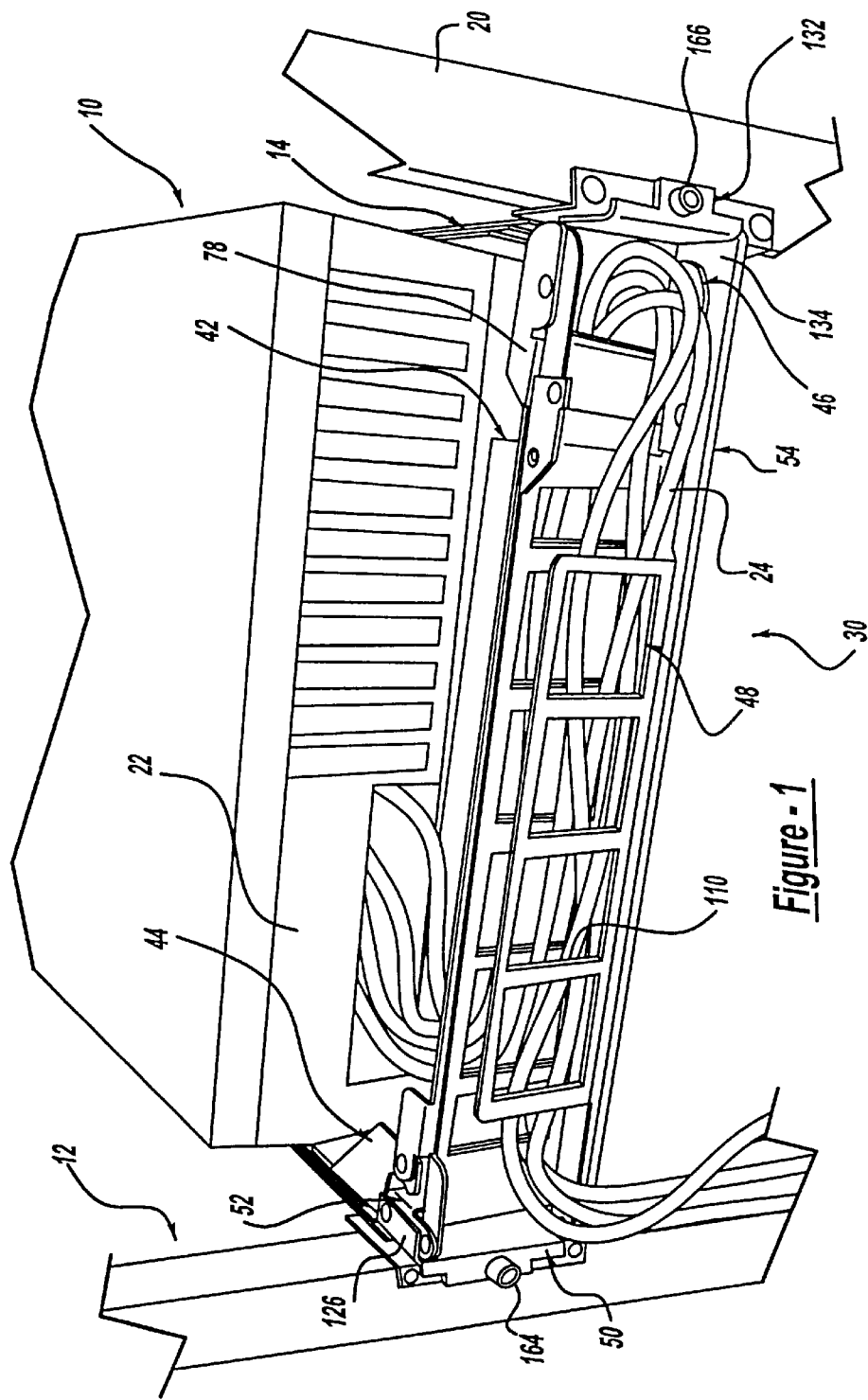
FIG. 1 is a cut-away, back perspective view of a computer server slidably mounted to a computer rack in a retracted position, and including a cable management arm, according to the invention.
Figure 2:
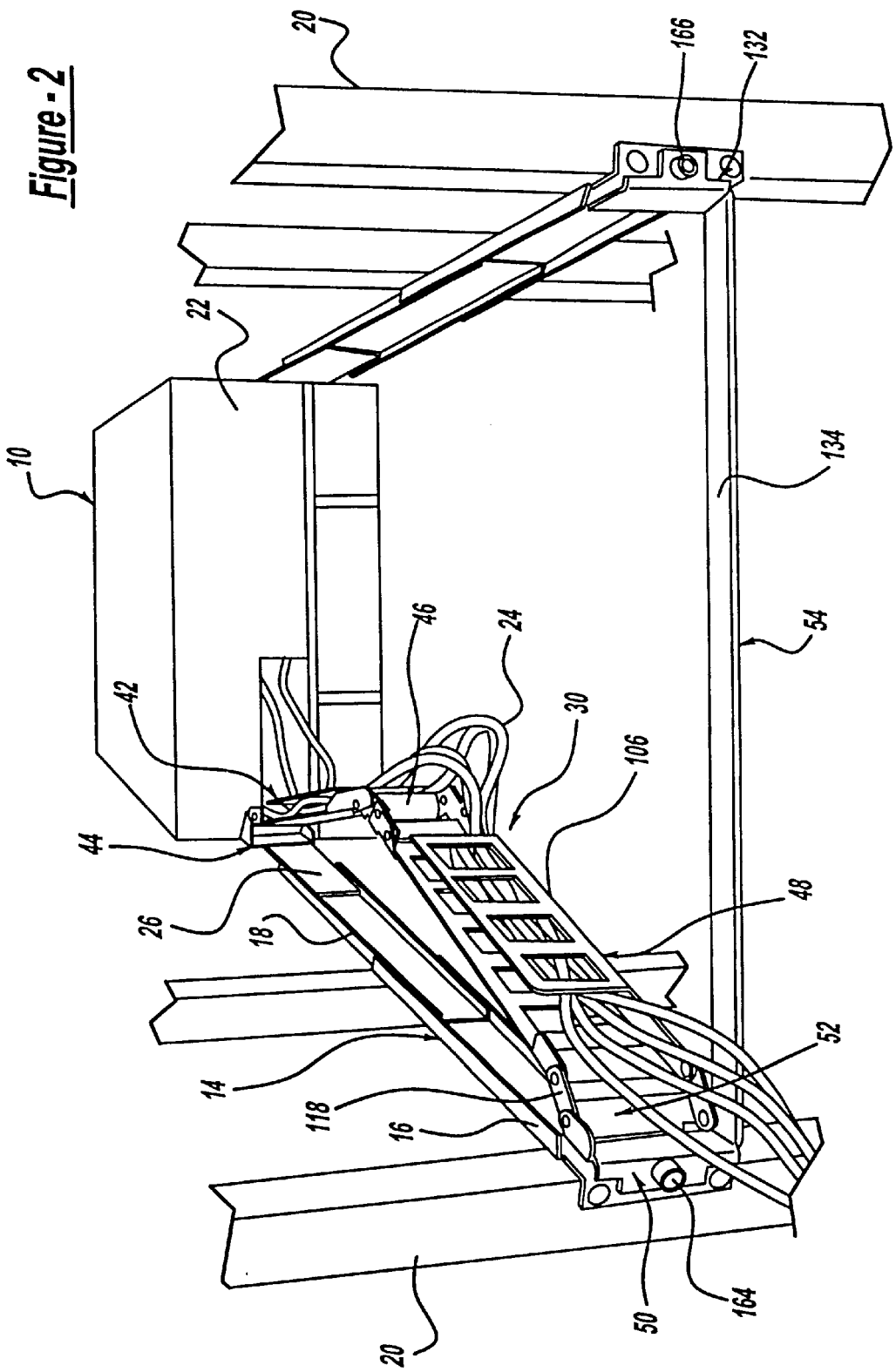
FIG. 2 is a back perspective view of the computer server in the rack shown in FIG. 1, where the computer server is pulled out from the rack and the cable management arm is extended.

FIG. 1 is a cut-away, back perspective view of a computer server unit 10 mounted within a computer rack 12. The computer unit 10 would be one of a plurality of computer server units (not shown) stacked in the rack 12. The other units are not shown herein for clarity purposes. The rack 12 includes four support columns 20 that provide support for the plurality of server units. The rack 12 also includes a separate slide assembly 14 attached to opposing sides of the unit 10, each having a stationary outer slider member 16, an intermediate slidable member 18 and an inner slidable member 26. FIG. 2 is a similar perspective view as shown in FIG. 1, where the unit 10 has been slid out of the rack 12 on the pair of slide assemblies 14. Each unit would be mounted to the rack by slide assemblies in this manner. The unit 10 includes a plurality of cables 24 attached to a back panel 22 of the unit 10 that are connected to power outlets, keyboards, mouses, or other computer servers in the rack 12, as is well understood in the art.

A cable management arm assembly 30, according to the invention, is mounted to one of the slide assemblies 14. As will be discussed in detail below, the arm assembly 30 is configured to hold the cables 24 in a neat and organized manner. Further, the cable management arm assembly 30 allows the unit 10 to be slidably "pulled out" from the rack 12, and still maintain cable organization. FIG. 1 shows the arm assembly 30 in its "home" position and FIG. 2 shows the arm assembly 30 in its "extended" position. When the unit 10 is retracted into the rack 12, and the arm assembly 30 is in its home position, the cable management arm assembly 30 is positioned substantially parallel to the back panel 22.

Figure 3:
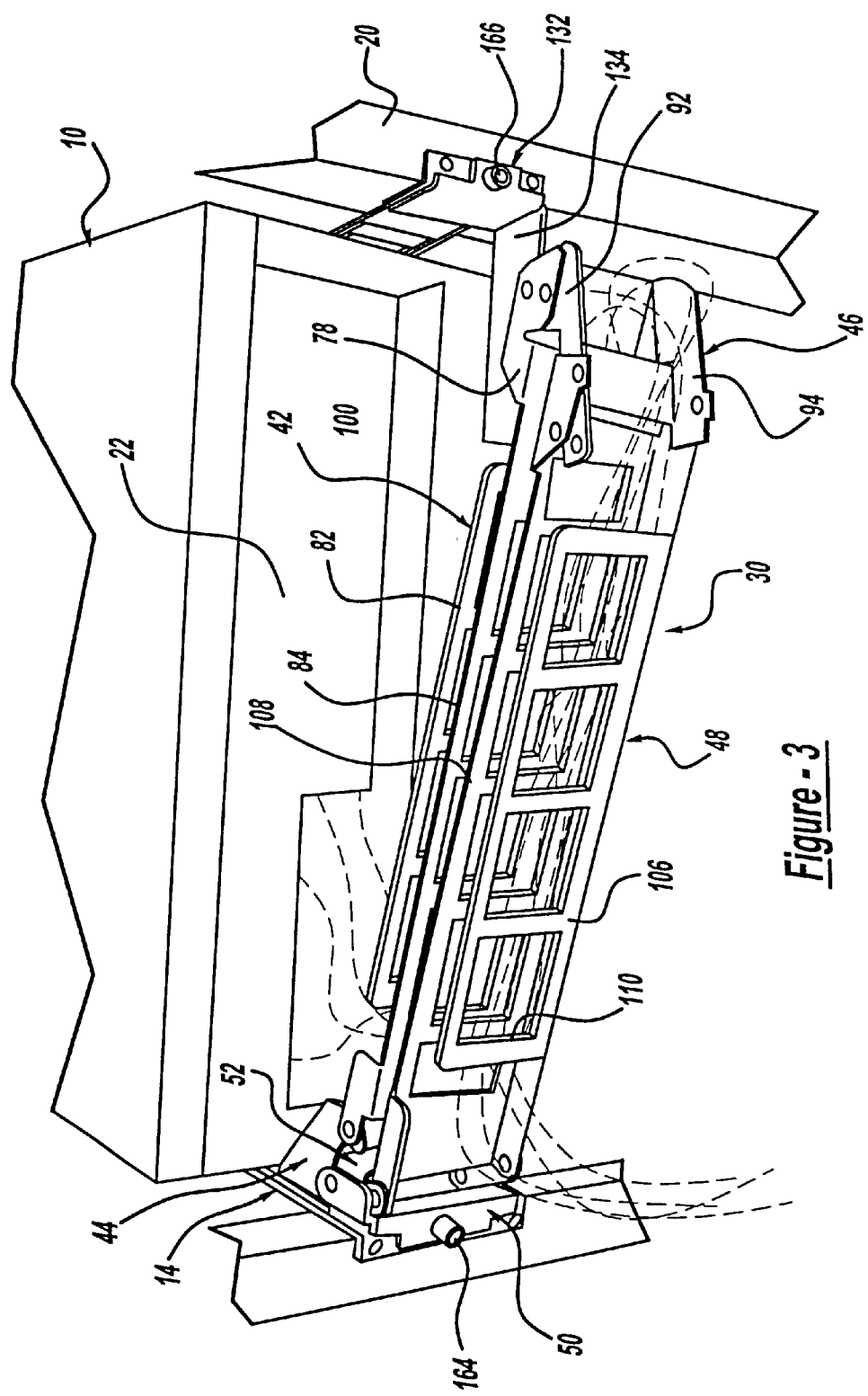
FIG. 3 is a back perspective view of the computer server in the rack shown in FIG. 1, where the cable management arm is in a partial break-away position, according to the invention.
Figure 4:
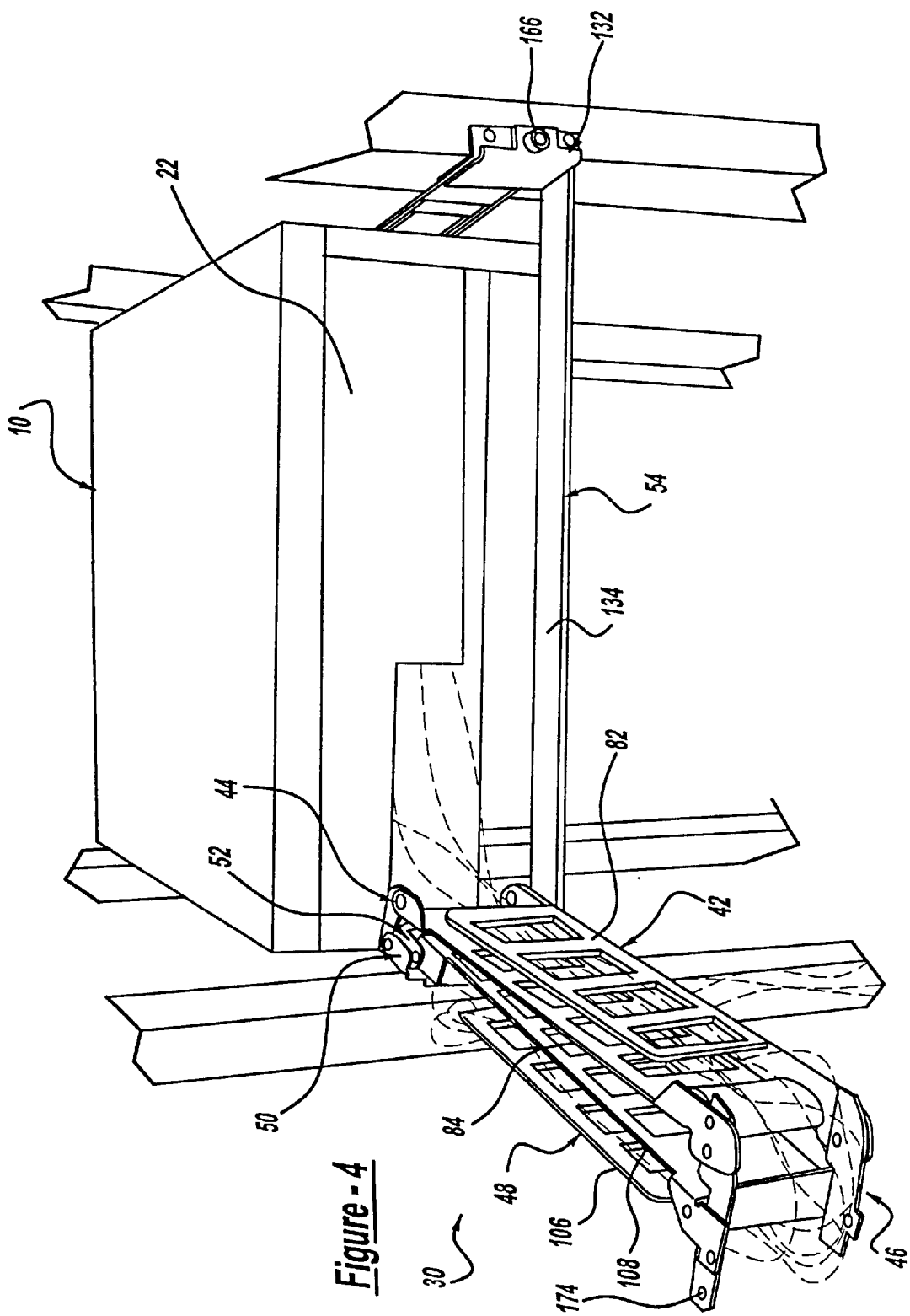
FIG. 4 is a back perspective view of the computer server in the rack shown in FIG. 3, where the cable management arm is in a full break-away position.
Figure 5:
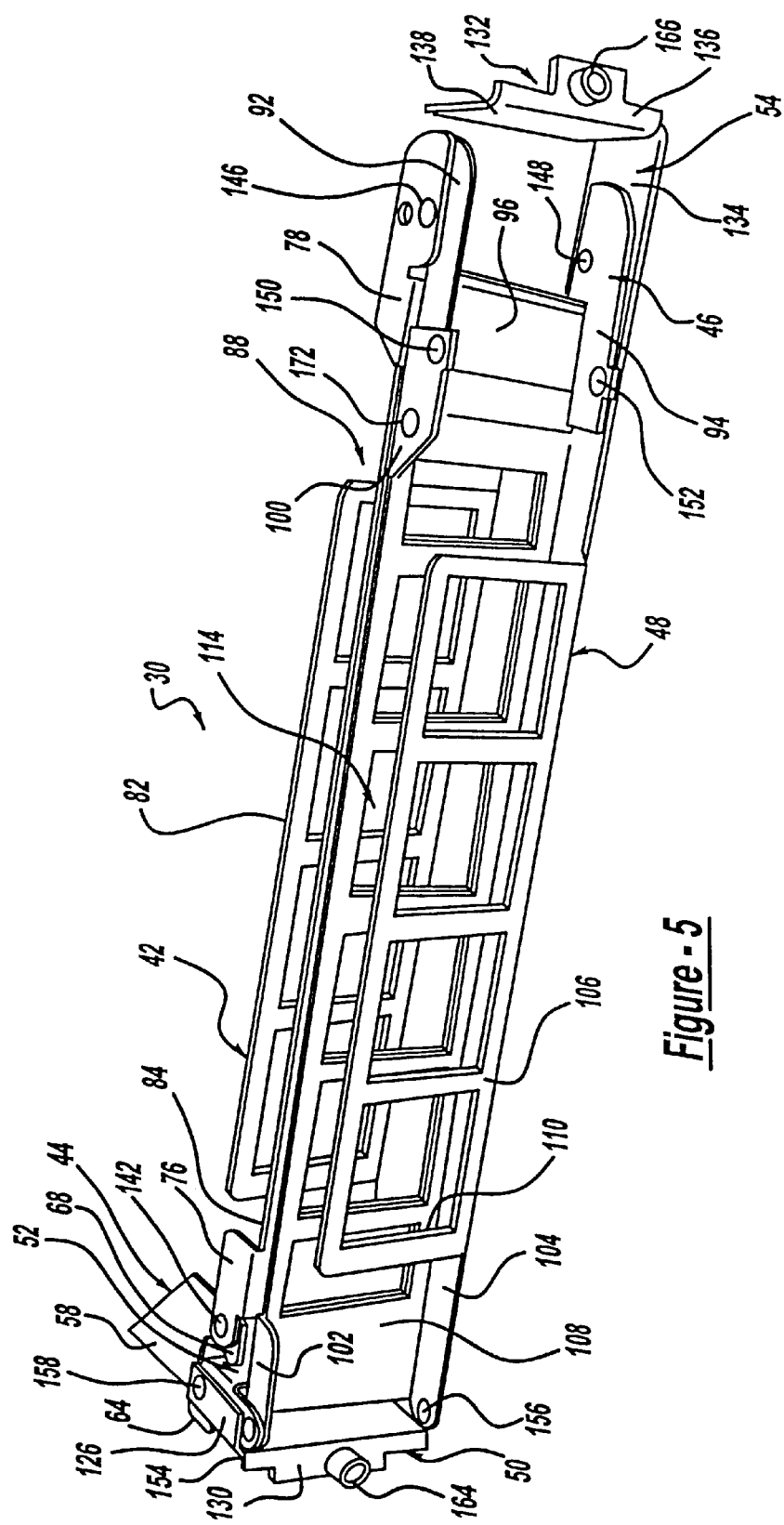
FIG. 5 is a perspective view of the cable management arm of the invention separated from the computer server and rack in a folded or retracted position.
Figure 6:
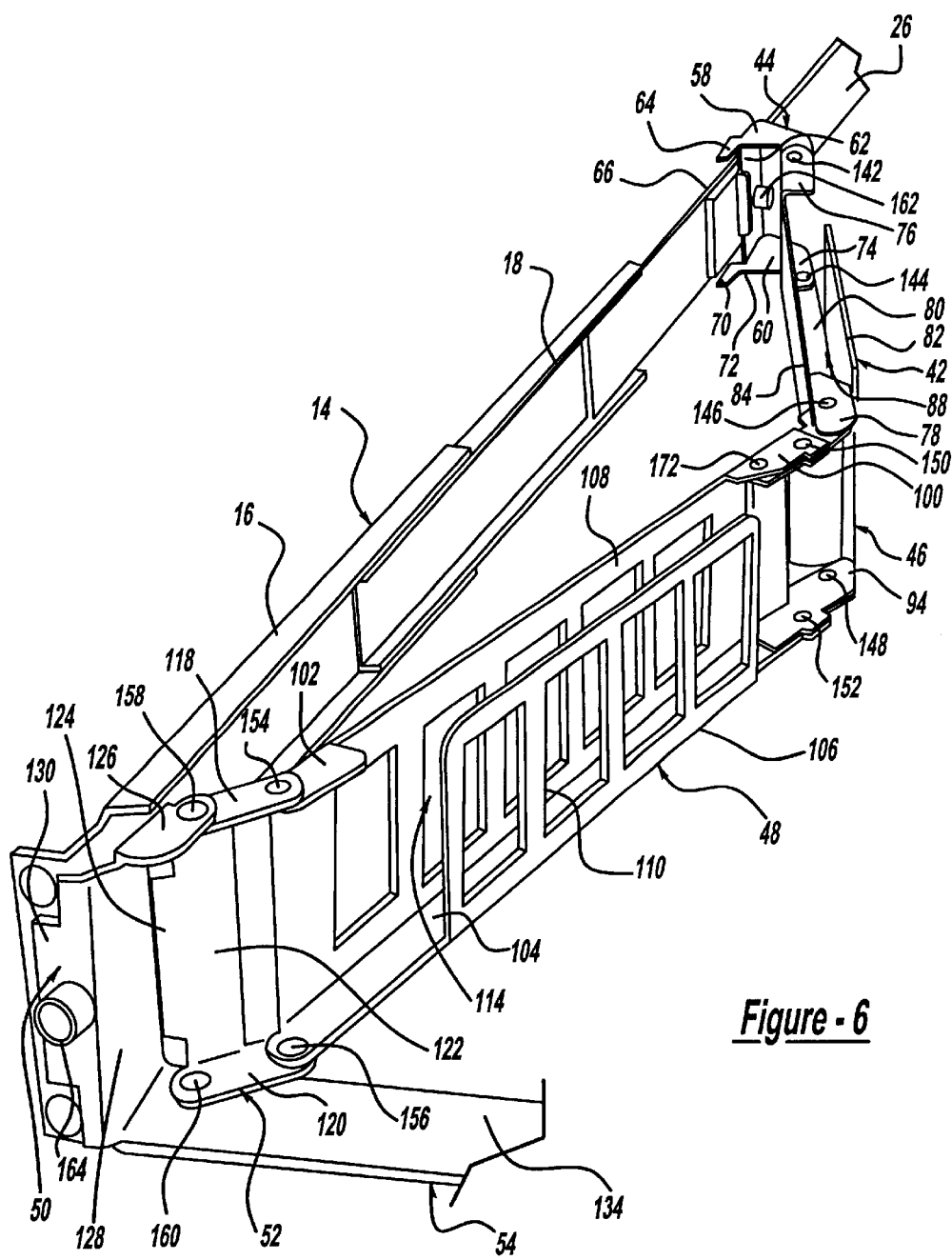
FIG. 6 is a perspective view of the cable management arm of the invention in a fully extended position and attached to a slide assembly.
Figure 7:
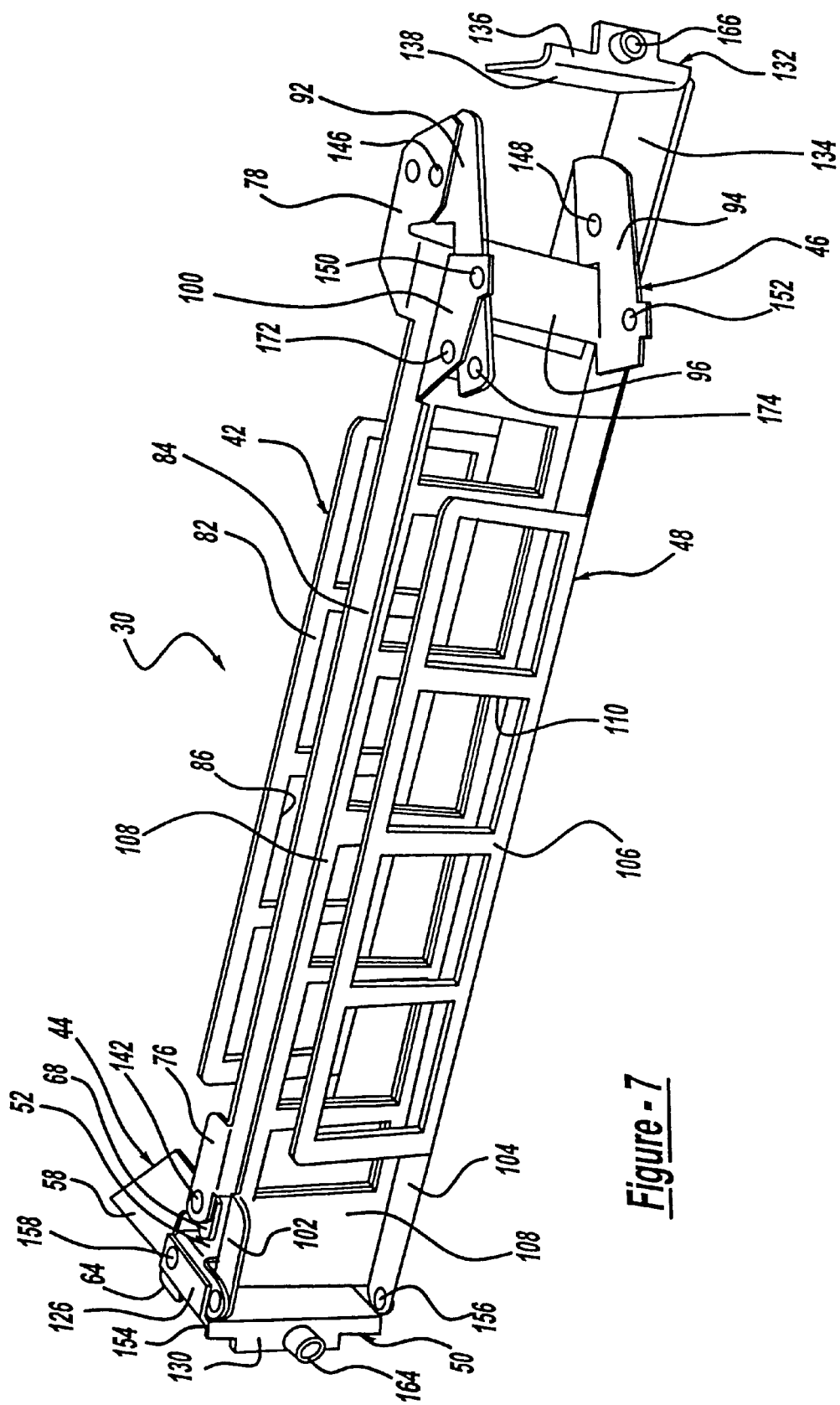
FIG. 7 is a perspective view of the cable management arm of the invention separated from the computer server and rack in a partial break-away position.
Figure 8:
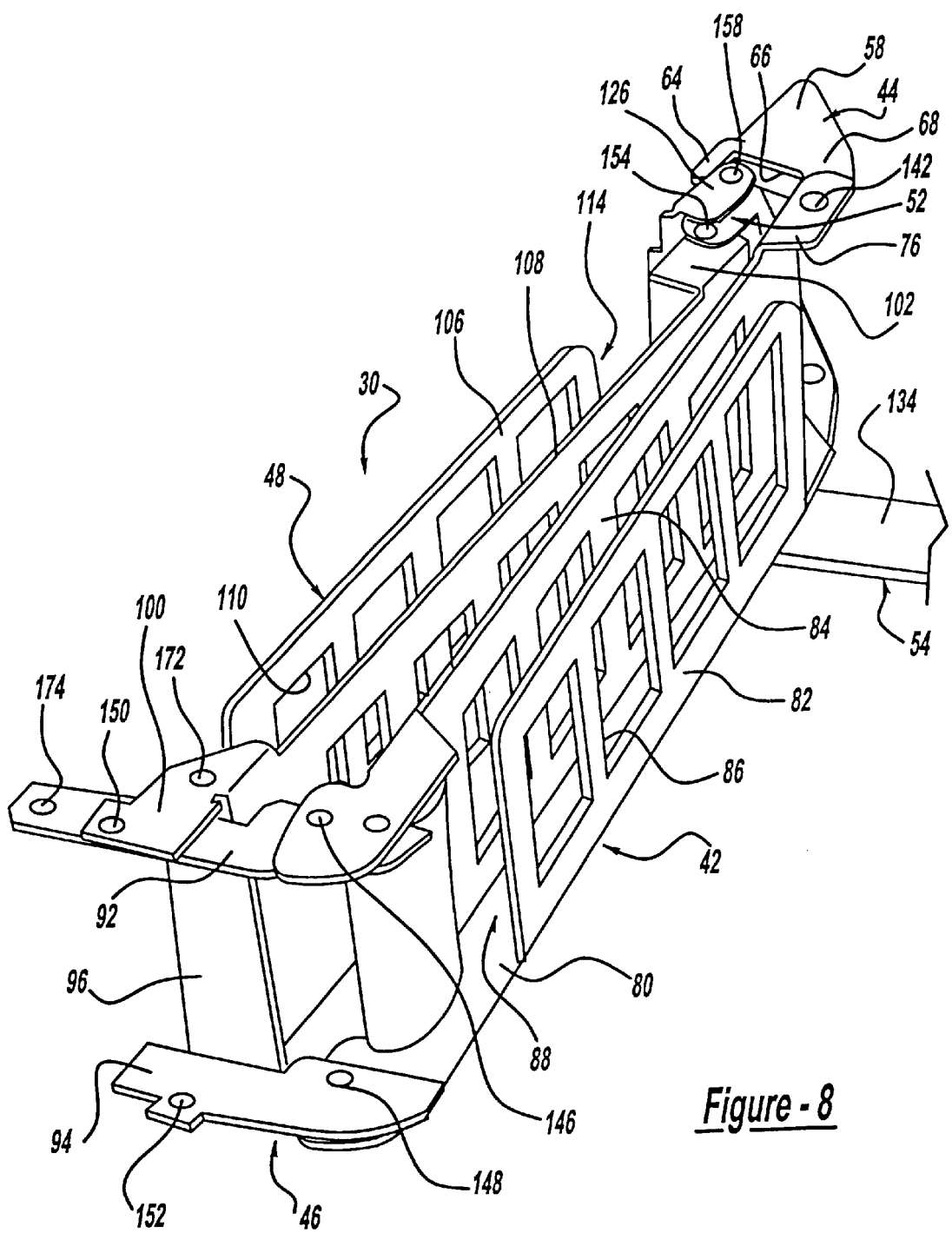
FIG. 8 is a perspective view of the cable management arm of the invention separated from the computer server and rack in a full breakaway position.

According to the invention, and as will be discussed in detail below, the arm assembly 30 is configured to be able to be moved to a "break-away" position where the arm assembly 30 pivots away from unit 10 when it is slid in on the slide assemblies 14. FIG. 3 shows the unit 10 retracted into the rack 12, where the arm assembly 30 is partially pivoted away from the back panel 22 of the unit 10 towards the break-away position. FIG. 4 shows the arm assembly 30 in the full break-away position to allow access to the back panel 22. FIG. 5 is a perspective view of the arm assembly 30 removed from the rack 12, and in its home position. FIG. 6 is a perspective view of the arm assembly 30 attached to the slide assembly 14, but removed from the rack 12 in its extended position. FIG. 7 is a perspective view of the arm assembly 30 removed from the rack 12 in a partial break-away position. FIG. 8 is a perspective view of the arm assembly 30 removed from the rack 12 in its full break-away position.

The arm assembly 30 includes an inner arm 42, an inner arm slide bracket 44, a break-away link 46, an outer arm 48, an outer arm slide bracket 50, an extension link 52 and a stabilizing arm 54. The height of the arms 42 and 48, the brackets 44 and 50 and the links 46 and 52 accommodate a 2U server, but can have other heights for other height servers. The inner arm slide bracket 44 includes an upper member 58, a lower member 60, and a support plate 62 connected therebetween. The upper member 58 includes a prong 64 and an extended piece 68 that define a U-shaped cut-out portion 66, and the lower member 60 includes a prong 70 and an extended piece 74 that define a U-shaped cut-out portion 72. The inner arm 42 includes a first upper flange 76, a second upper flange 78, a base plate 80, and opposing side plates 82 and 84 connected to the base plate 80. The opposing side plates 82 and 84 include a series of openings 86 extending therethrough. The base plate 80 and the opposing side plates 82 and 84 define a trough 88 in the inner arm 42 for accepting and holding the cables 24.

The break-away link 46 includes an upper flange 92, a lower flange 94 and a support plate 96 connected therebetween. The outer arm 48 includes a first upper flange 100, a second upper flange 102, a base plate 104 and opposing side plates 106 and 108 connected to the base plate 104. The opposing side plates 106 and 108 also include a series of openings 110 extending therethrough. The opposing side plates 106 and 108 and the base plate 104 define a trough 114 in the outer arm 48 for also accepting the cables 24. The extension link 52 includes an upper member 118, a lower member 120 and a side plate 122 connected thereto. The side plate 122 includes an extension flange 124 extending from one side. The outer arm slide bracket 50 includes an upper flange 126, a side plate 128 and an end plate 130. The stabilizing arm 54 includes a base plate 134 and a stabilizing arm bracket 132. The bracket 132 includes an end plate 136 and a side plate 138. The outer arm slide bracket 50, the stabilizing arm 54 and the stabilizing arm bracket 132 are actually a single piece unit.

The upper member 58 of the inner arm slide bracket 44 is pivotally coupled to the first flange 76 of the inner arm 42 by a pivot pin 142 and a nylon washer, and the lower member 60 of the inner arm slide bracket 44 is pivotally coupled to one end of the base plate 80 of the inner arm 42 by a pivot pin 144 and a nylon washer. The second flange 78 of the inner arm 42 is pivotally coupled to one end of the upper flange 92 of the break-away link 46 by a pivot pin 146 and a nylon washer, and an opposite end of the base plate 80 of the inner arm 42 is pivotally coupled to one end of the lower flange 94 of the break-away link 46 by a pivot pin 148 and a nylon washer.

The first flange 100 of the outer arm 48 is pivotally coupled to the other end of the upper flange 92 of the break-away link 46 by a pivot pin and a nylon washer 150, and one end of the base plate 104 of the outer arm 48 is pivotally coupled to the other end of the lower flange 94 of the break-away link by a pivot pin 152 and a nylon washer. The second flange 102 of the outer arm 48 is coupled to one end of the upper member 118 of the extension link 52 by a pivot pin 154 and a nylon washer, and the other end of the base plate 104 of the outer arm 48 is pivotally coupled to one end of the lower member 120 of the extension link 52 by a pivot pin 156 and a nylon washer. The other end of the upper member 118 of the extension link 52 is pivotally coupled to the upper flange 126 of the outer arm slide bracket 50 by a pivot pin 158 and a nylon washer, and the other end of the lower member 120 of the extension link 52 is pivotally coupled to one end of the stabilizing arm 54 by a pivot pin 160 and a nylon washer.

This configuration of the arm assembly pieces allows the arm assembly 30 to extend the server unit 10 up to 30.5 inches for servicing and to be pivoted away from the back panel 22 to the break-away position when the arm assembly 30 is in the home position so that it is easier to gain access to the back panel 22. The extension link 52 gives the arm assembly 30 added extension over those cable management arms known in the art so that the unit 10 can be extended even farther for service convenience.

A spring loaded bolt 162 extends through the support plate 62 of the inner arm slide bracket 44, and is operable to be threadably secured to the inner slidable member 26 of the slide assembly 14 proximate the back panel 22. A spring loaded bolt 164 extends through the end plate 130 of the outer arm slide bracket 50, and is operable to be threadably secured to the outer slide member 16 of the slide assembly 14. A spring loaded bolt 166 extends through the end plate 136 of the outer arm slide bracket 50, and is operable to be threadably secured to the second outer slide member 16 that supports the server 10. Although spring loaded bolts are employed to secure the arm assembly 30 to the two slide assemblies 14 in this embodiment, other suitable devices can be used to secure the arm assembly 30 to the rack 12.

After the arm assembly 30 is mounted to the slide assembly 14 and the unit 10 is mounted to the slide assemblies 14. The cables 24 coupled to the back panel 22 are collected and threaded into the trough 88 of the inner arm 42. The cables 24 are then threaded around the break-away link 46, and into one end of the trough 114 of the outer arm 48. The cables 24 then extend out of an opposite end of the trough 114, and are directed to their connection point in the system. The troughs 88 and 114 allow the cables 24 to be held in place without the need for Velcro straps and the like.

Figure 9:
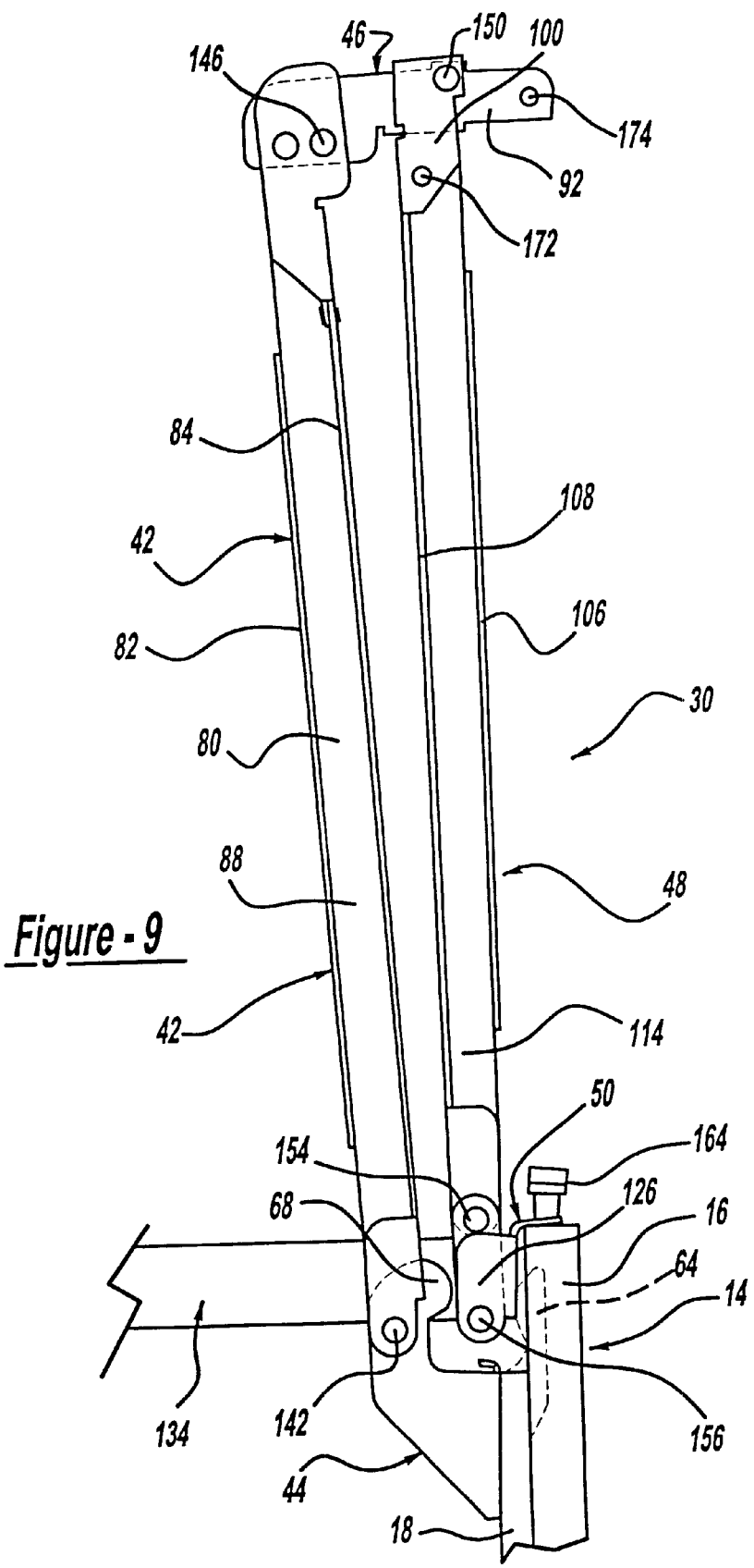
FIG. 9 is a top view of the cable management arm of the invention attached to the slide assembly and in the full break-away position.
Figure 10:
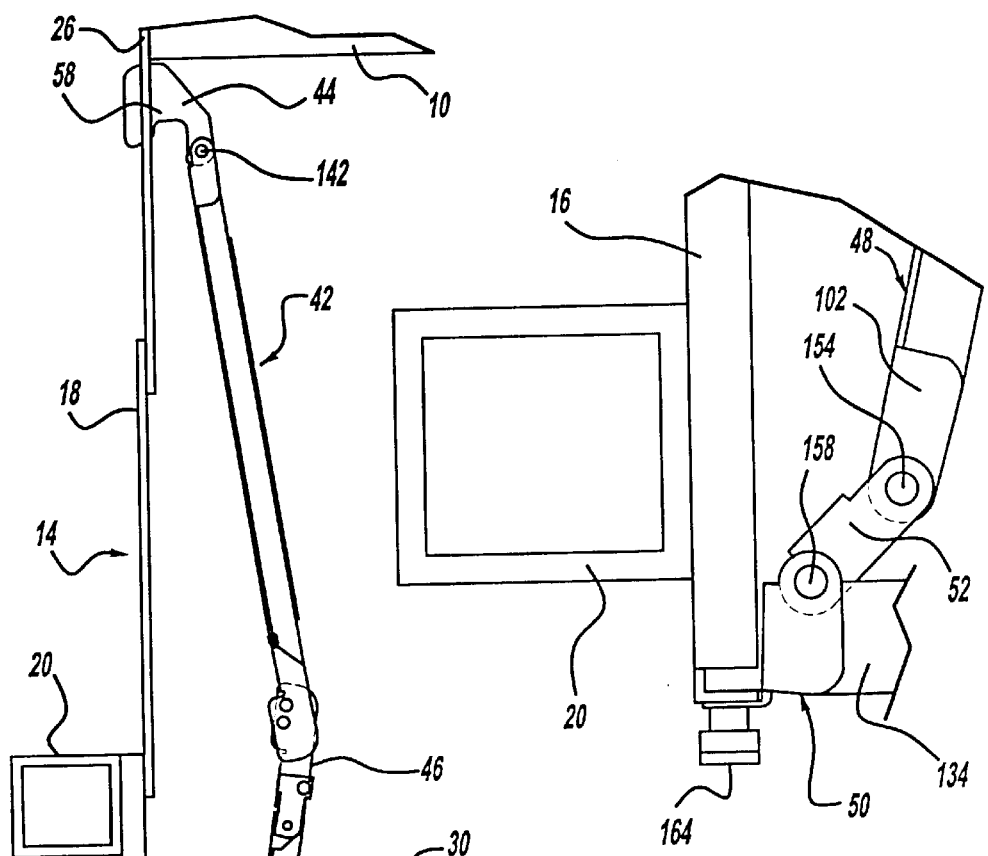
FIG. 10 is a top view of one end of the cable management arm coupled to the slide assembly in the extended position.
Figure 11:
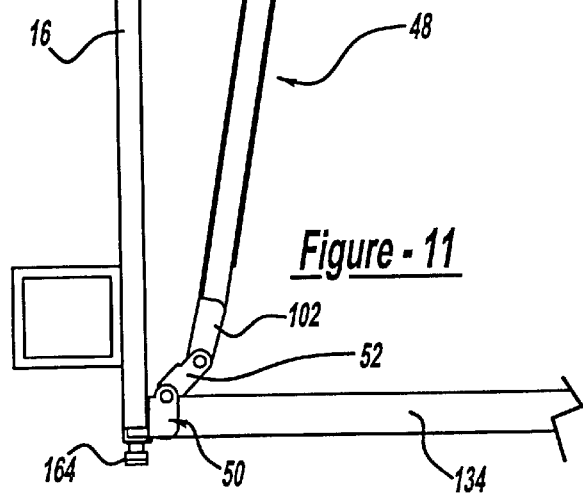
FIG. 11 is a top view of the cable management arm of the invention in an extended position and connected to the slide assembly.

FIG. 9 is a top view of the arm assembly 30 in the full break-away position; FIG. 10 is a cut-away, top view of an end of the arm assembly 30 showing the slide bracket 50 coupled to an end of the stationary member 16; and FIG. 11 is a top view of the arm assembly 30 coupled to the slide assembly 14.

When the arm assembly 30 is in the home position, the server unit 10 is retracted into the rack 12. The inner arm slide bracket 44 is secured to the inner slidable member 26 so that the upper member 118 of the extension link 52 is positioned below and parallel to the upper flange 126, and ends of the upper member 118, the lower member 120, the upper flange 126 and the side plate 128 are positioned within the cut-out portions 66 and 72, as shown in FIG. 5. The extension link 52 is folded in this orientation so that it doesn't add to the length of the outer arm 48.

To get in this orientation, the extension link 52 pivots on the pivot pins 154 and 156 and the pivot pins 158 and 160. Further, the inner arm 42 pivots on the pivot pins 142 and 144 and the pivot pins 146 and 148, and the outer arm 48 pivots on the pivot pins 154 and 156 so that the inner arm 42 is substantially perpendicular to the inner arm slide bracket 44, and the inner arm 42 and the outer arm 48 are substantially parallel to each other, where the break-away link 46 forms an extension of the outer arm 48, as shown in FIG. 5. Also, the inner arm 42 and the outer arm 48 are positioned parallel to and above the base plate 134 of the stabilizing arm 54.

When the server 14 is slid out of the rack 12 on the slide assemblies 14 the various pivot pins associated with the arm assembly 30 cause the inner arm 42 to pivot relative to the outer arm 48 into the "V-shape" orientation shown in FIG. 6. Particularly, the inner arm 42 pivots relative to the inner arm slide bracket 44 on the pivot pins 142 and 144, the inner arm 42 pivots relative to the break-away link 46 on the pivot pins 146 and 148, the outer arm 48 pivots relative to the extension link 52 on the pivot pins 154 and 156, and the extension link 52 pivots relative to the outer arm bracket 50 on the pivot pins 158 and 160. The break-away link 46 and the outer arm 48 do not move relative to each other. The extension link 52 allows the arm assembly 30 to be extended to about 30.5 inches to accommodate state of the art slide assemblies. The extension flange 124 of the side plate 122 contacts the outer arm slide bracket 50 when the arm assembly 30 is moved to the extended position. This prevents the extension link 52 from over-rotating, thus allowing it to return to the home position. The extension flange 124 keeps the extension link 52 at about a 45° angle relative to the member 16 when the arm assembly 30 is in the extended position. The extension link 52 is folded in the home position so it does not add length to the outer arm 48 so that the arms 42 and 48 fit between the brackets 50 and 132.

When the arm assembly 30 is moved from the home position to the break-away position, as shown in FIGS. 7 and 8, the inner arm 42 pivots relative to the inner arm slide bracket 44 on the pivot pins 142 and 144, the inner arm 42 pivots relative to the break-away link 46 on the pivot pins 146 and 148, the outer arm 48 pivots relative to the break-away link on the pivot pins 150 and 152, and the outer arm 48 pivots relative to the extension link 52 on the pivot pins 154 and 156. In the break-away orientation, the inner arm 42 and the outer arm 48 are still relatively parallel to each other, but are now both substantially perpendicular to the breakaway link 46. The cut-out portions 66 and 72 maintain the extension link 52 in its home position when the arm assembly 30 is moved to the break-away position. Also, the extended pieces 68 and 74 push against the side plate 122 and hold it parallel to the support plate 62, and act as leverage points when the arm assembly 30 is moved to the break-away position.

Because of the orientation of the parts of the arm assembly 30, the arm assembly 30 is able to be moved to a full break-away position, or about 90° relative to the stabilizing arm 54. One key feature that allows the arm assembly 30 to be opened this far is that the pin 150 is off axis, or behind, a line through the pins 154 and 146, and the pin 152 is off axis, or behind a line drawn through the pins 156 and 148 when the arm assembly 30 is on the home position. The configuration of the arm assembly 30, as discussed herein, allows the arm assembly 30 to be moved to the break-away position without the need for fasteners, tools, buttons, thumbscrews, etc.

When the arm assembly 30 is in the home position, the outer arm 48 is locked to the break-away link 46 by a dimple 172 in the first upper flange 100 of the outer arm 48 and a recess 174 in the upper flange 92 of the break-away link 46. When the user moves the arm from the home position to the break-away position, the user must apply enough force to break this locking engagement. The stabilizing arm 54 helps maintain arm assembly integrity and stabilization against this force.

The foregoing discussion discloses and describes merely exemplary embodiments of the present invention. One skilled in the art will readily recognize from such discussion, and from the accompanying drawings and claims, that various changes, modifications or variations can be made therein without departing from the spirit and scope of the invention as defined in the following claims.

What is claimed is:

1. A cable management arm assembly for organizing cables of a computer server, said arm assembly comprising:
   an inner arm slide bracket;
   an inner arm section including a first end and a second end, said first end of the inner arm section being pivotably mounted to the inner arm slide bracket, said inner arm section including a first trough defined by a base plate and opposing side plates;
   a break-away link including a first end and a second end, said first end of the break-away link being pivotably mounted to the second end of the inner arm section;
   an outer arm section including a first end and a second end, said first end of the outer arm section being pivotably mounted to the second end of the break-away link, said outer arm section including a second trough defined by a base plate and opposing side plates; and
   an outer arm slide bracket pivotably coupled relative to the second end of the outer arm section, wherein the inner arm section pivots relative to the break-away link to a first position where one of said side plates defining the first trough is parallel and adjacent to one of said side plates defining the second trough, and wherein the inner arm section and the outer arm section pivot relative to the break-away link to a second position where the side plate of the first trough is almost parallel to the side plate of the second trough but is disposed farther away therefrom than in the first position; said break-away link applying a locking force to lock said inner and outer arm sections in said first position until sufficient force is exerted when pivoting said inner and outer arm sections to said second position to overcome said locking force.

2. The assembly according to claim 1 wherein the break-away link includes a first indentation and the outer arm section includes a second indentation that are oriented relative to each other to apply said locking force.

3. The assembly according to claim 1 wherein the opposing side plates include openings extending therethrough.

4. The assembly according to claim 1 wherein the inner arm bracket includes a bolt and the outer arm section includes a bolt for securing the assembly to a support structure.

5. The assembly according to claim 4 wherein the inner arm slide bracket is operable to be coupled to a slidable member of a slide assembly, and the outer arm bracket is operable to be coupled to a stationary member of the slide assembly.

6. The assembly according to claim 4 wherein the bolts are spring-loaded bolts.

7. The assembly according to claim 1 further comprising an extension link pivotably coupled between the outer arm bracket and the outer arm section.

8. The assembly according to claim 7 wherein the extension link includes a tab member that contacts the outer arm slide bracket when the inner arm section and the outer arm section pivot to a third position, said inner arm section and said outer arm section being in a V-shape configuration in the third position.

9. The assembly according to claim 7 wherein the inner arm slide bracket includes an extended piece, said extended piece contacting and holding the extension link when the arm assembly is moved from the first position to the second position.

10. The assembly according to claim 7 wherein the inner arm bracket includes at least one pair of prongs defining at least one cut-out section in the inner arm bracket, said at least one cut-out section being formed around a side plate of the extension link when the arm assembly is in the first position and in the second position.

11. The assembly according to claim 1 wherein the outer arm section and the break-away link extend along a common axis and the inner arm section extends along another axis where the two axes are substantially parallel to each other when the arm assembly is in the first position.

12. The assembly according to claim 11 wherein the break-away link extends along an axis that is substantially perpendicular to the axis of the inner arm section and the axis of the outer arm section when the arm assembly is in the second position.

13. The assembly according to claim 1 further comprising a stabilizing arm section for stabilizing the arm assembly when it is moved from the first position to the second position.

14. The assembly according to claim 13 wherein the stabilizing arm section is coupled to the outer arm bracket.

15. The assembly according to claim 13 wherein the stabilizing arm section includes a stabilizing arm bracket.

16. The assembly according to claim 13 wherein the break-away link is pivotably mounted to the inner arm section by a pair of opposing pins, the outer arm section is pivotably mounted to the break-away link by a pair of opposing pivot pins, and the outer arm bracket is pivotably coupled relative to the outer arm section by a pair of opposing pivot pins.

17. A cable management arm assembly for organizing cables of a computer server, said computer server operable to be mounted to a computer rack by a pair of opposing slide assemblies, each slide assembly including a stationary member mounted to the rack and a slidable member mounted to the server and slidable relative to the stationary member, said arm assembly holding the cables when the computer server is in a home position within the rack, when the computer server is slid out of the rack on the slide assemblies to an extended position, and when the arm assembly is in a break-away position where the arm assembly is moved away from a back panel of the computer server and the computer server is in the home position, said arm assembly comprising:

an inner arm bracket operable to be mounted to the slidable member;

an inner arm section including a first end and a second end, said first end of the inner arm section being pivotably mounted to the inner arm bracket;

a break-away link including a first end and a second end, said first end of the break-away link being pivotably mounted to the second end of the inner arm section;

an outer arm section including a first end and a second end, said first end of the outer arm section being pivotably mounted to the second end of the break-away link; and an outer arm bracket pivotably coupled relative to the second end of the outer arm section, said inner arm section and said outer arm section being substantially parallel when the arm assembly is in the home position, wherein the inner arm section pivots relative to the inner arm bracket and the break-away link and the outer arm section pivots relative to the outer arm bracket when the cable arm assembly is moved from the home position to the extended position, and wherein the inner arm section pivots relative to the inner arm bracket and the break-away link and the outer arm section pivots relative to the break-away link and the outer arm bracket when the arm assembly is moved from the home position to the break-away position; said break-away link applying a locking force to lock said inner and outer arm sections in said home position until sufficient force is exerted when pivoting said inner and outer arm sections to said break-away position to overcome said locking force.

18. The assembly according to claim 17 wherein the break-away link is substantially perpendicular to a length of both of the inner arm section and the outer arm section when the arm assembly is in the break-away position.

19. The assembly according to claim 17 wherein both the inner arm section and the outer arm section include a base plate and opposing side plates defining a trough so as to position and hold the cables in the inner arm section and the outer arm section.

20. The assembly according to claim 19 wherein the opposing side plates include openings extending therethrough.

21. The assembly according to claim 17 wherein the break-away link includes a first indentation and the outer arm section includes a second indentation that are oriented relative to each other to apply said locking force.

22. The assembly according to claim 17 further comprising an extension link pivotably coupled between the outer arm bracket and the outer arm section.

23. The assembly according to claim 22 wherein the extension link includes a tab member that contacts the outer arm slide bracket when the inner arm section and the outer arm section pivot to the extended position, said inner arm section and said outer arm section being in a V-shape configuration in the extended position.

24. The assembly according to claim 22 wherein the inner arm slide bracket includes an extended piece, said extended piece contacting and holding the extension link when the arm assembly is moved from the home position to the break-away position.

25. The assembly according to claim 22 wherein the inner arm bracket includes a pair of prongs defining opposing cut-out sections in the inner arm bracket, said cut-out sections being formed around a side plate of the outer arm bracket and a side plate of the extension link when the arm assembly is in the home position and in the break-away position.

26. The assembly according to claim 17 further comprising a stabilizing arm section for stabilizing the arm assembly when it is moved from the home position to the break-away position.

27. The assembly according to claim 26 wherein the stabilizing arm section is coupled to the outer arm bracket.

28. The assembly according to claim 26 wherein the stabilizing arm section includes a stabilizing arm bracket.

29. The assembly according to claim 17 wherein the break-away link is pivotably mounted to the inner arm section by a pair of opposing pins, the outer arm section is pivotably mounted to the break-away link by a pair of opposing pivot pins, and the outer arm bracket is pivotably coupled relative to the outer arm section by a pair of opposing pivot pins.

30. The assembly according to claim 17 wherein the inner arm bracket is secured to the slidable member by a bolt and the outer arm bracket is secured to the stationary member by a bolt.

31. The assembly according to claim 30 wherein the bolts are spring-loaded bolts.

32. A cable management arm assembly for organizing cables of a computer server, said computer server operable to be mounted to a computer rack by a pair of opposing slide assemblies, each slide assembly including a stationary member mounted to the rack and a slidable member mounted to the server and slidable relative to the stationary member, said arm assembly holding the cables when the computer server is in a home position within the rack, when the computer server is slid out of the rack on the slide assemblies to an extended position, and when the arm assembly is in a break-away position where the arm assembly is moved away from a back panel of the computer server and the computer server is in the home position, said arm assembly comprising:

an inner arm bracket operable to be mounted to one of the slidable members, said inner arm bracket including at least one pair of prongs defining at least one cut-out section in the inner arm bracket;

an inner arm section including a first end and a second end, said first end of the inner arm section being pivotably mounted to the inner arm bracket;

a break-away link including a first end and a second end, said first end of the break-away link being pivotably mounted to the second end of the inner arm section;

an outer arm section including a first end and a second end, said first end of the outer arm section being pivotably mounted to the second end of the break-away link;

an extension link including a first end and a second end, said first end of the extension link being pivotably mounted to the second end of the outer arm section; and an outer arm bracket pivotably coupled relative to the second end of the outer arm section, said inner arm section and said outer arm section being substantially parallel when the arm assembly is in the home position, wherein the inner arm section pivots relative to the inner arm bracket and the break-away link and the outer arm section pivots relative to the outer arm bracket when the cable arm assembly is moved from the home position to the extended position, and wherein the inner arm section pivots relative to the inner arm bracket and the break-away link and the outer arm section pivots relative to the break-away link and the outer arm bracket when the arm assembly is moved from the home position to the break-away position.

33. The assembly according to claim 32 wherein the break-away link is substantially perpendicular to a length of both of the inner arm section and the outer arm section when the arm assembly is in the break-away position.

34. The assembly according to claim 32 wherein both the inner arm section and the outer arm section include a base plate and opposing side plates defining a trough so as to position and hold the cables in the inner arm section and the outer arm section.

35. The assembly according to claim 34 wherein the opposing side plates include openings extending therethrough.

36. The assembly according to claim 32 wherein the break-away link includes a first indentation and the outer arm section includes a second indentation that are oriented relative to each other to increase the force necessary to pivot the outer arm section relative to the break-away link.

37. The assembly according to claim 32 further comprising a stabilizing arm section for stabilizing the arm assembly when it is moved from the home position to the break-away position.

38. The assembly according to claim 37 wherein the stabilizing arm section is coupled to the outer arm bracket.

39. The assembly according to claim 37 wherein the stabilizing arm section includes a stabilizing arm bracket.

40. A cable management arm assembly for organizing cables of a computer server, said computer server operable to be mounted to a computer rack by a pair of opposing slide assemblies, each slide assembly including a stationary member mounted to the rack and a slidable member mounted to the server and slidable relative to the stationary member, said arm assembly holding the cables, when the computer server is slid out of the rack on the slide assemblies to an extended position, and when the computer server is in a home position within the rack, and when the arm assembly is in a break-away position where the arm assembly is moved away from a back panel of the computer server and the computer server is in the home position, said arm assembly comprising:

an inner arm bracket operable to be mounted to one of the slidable members;

an inner arm section including a first end and a second end, said first end of the inner arm section being pivotably mounted to the inner arm bracket by a pair of opposing pivot pins, said inner arm section including a first trough defined by a base plate and opposing side plates;

a break-away link including a first end and a second end, said first end of the break-away link being pivotably mounted to the second end of the inner arm section by a pair of opposing pivot pins;

an outer arm section including a first end and a second end, said first end of the outer arm section being pivotably mounted to the second end of the break-away link by a pair of opposing pivot pins, said outer arm section including a second trough defined by a base plate and opposing side plates;

an extension link including a first end and a second end, said first end of the extension link being pivotably mounted to the second end of the outer arm section by a pair of opposing pivot pins;

an outer arm bracket pivotably coupled to the second end of the extension link by a pair of opposing pivot pins, said outer arm bracket operable to be mounted to the rack proximate one of the stationary members; and a stabilizing arm section coupled to the outer arm bracket, said stabilizing arm section including a stabilizing bracket connected to an end of the stabilizing arm section opposite to the outer arm bracket, said stabilizing arm bracket operable to be coupled to the rack proximate another stationary member of a slide assembly, said inner arm section and said outer arm section being substantially parallel when the arm assembly is in the home position, wherein the inner arm section pivots relative to the inner arm bracket and the break-away link and the outer arm section pivots relative to the outer arm bracket and the extension link when the cable arm assembly is moved from the home position to the extended position, and wherein the inner arm section pivots relative to the inner arm bracket and the break-away link, the extension link and the outer arm section pivots relative to the break-away link and the outer arm bracket when the arm assembly is moved from the home position to the break-away position.

41. The assembly according to claim 40 wherein the break-away link is substantially perpendicular to a length of both of the inner arm section and the outer arm section when the arm assembly is in the break-away position.

42. The assembly according to claim 40 wherein the opposing side plates include openings extending therethrough.

43. The assembly according to claim 40 wherein the break-away link includes a first indentation and the outer arm section includes a second indentation that are oriented relative to each other to increase the force necessary to pivot the outer arm section relative to the break-away link.

44. The assembly according to claim 40 wherein the inner arm bracket is secured to the slidable member by a bolt and the outer arm bracket is secured to the stationary member by a bolt.

45. The assembly according to claim 44 wherein the bolts are spring-loaded bolts.

* * * * *